(12) United States Patent
Ota

(10) Patent No.: US 6,483,569 B2
(45) Date of Patent: Nov. 19, 2002

(54) EXPOSURE METHOD AND EXPOSURE APPARATUS

(75) Inventor: Kazuya Ota, Tokyo (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/817,065

(22) Filed: Mar. 27, 2001

(65) Prior Publication Data

US 2001/0043314 A1 Nov. 22, 2001

Related U.S. Application Data

(62) Division of application No. 09/388,607, filed on Sep. 2, 1999, now Pat. No. 6,228,544, which is a continuation of application No. 08/908,429, filed on Aug. 7, 1997, now abandoned.

(30) Foreign Application Priority Data

Aug. 8, 1996 (JP) ............................................. 8-209704

(51) Int. Cl.[7] ...................... G03B 27/52; G03B 27/42; G03B 27/58
(52) U.S. Cl. .............................. 355/30; 355/53; 355/72
(58) Field of Search ........................ 355/30, 53, 72–76, 355/77; 378/34, 35; 430/30, 327; 250/443.1, 440.11

(56) References Cited

U.S. PATENT DOCUMENTS

| 4,720,732 A | * | 1/1988 | Tsutsui ........................ 355/30 |
| 4,969,168 A | * | 11/1990 | Sakamoto et al. ............ 378/34 |
| 5,063,582 A | * | 11/1991 | Mori et al. .................... 378/30 |
| 5,134,052 A | | 7/1992 | Hipps, Sr. et al. ......... 430/327 |
| 5,329,126 A | * | 7/1994 | Amemiya et al. ...... 250/453.11 |

FOREIGN PATENT DOCUMENTS

| JP | 3-138369 | * | 6/1991 |
| JP | 5-129181 | | 5/1993 |

* cited by examiner

*Primary Examiner*—Russell Adams
*Assistant Examiner*—Hung Henry Nguyen
(74) *Attorney, Agent, or Firm*—Nixon & Vanderhye P.C.

(57) ABSTRACT

While a current photosensitive substrate is being exposed on a substrate stage, the next photosensitive substrate for exposure is loaded on a temperature-adjustment plate for a predetermined time to remove a quantity of heat corresponding to a heat accumulation on the substrate stage during exposure. A substrate transporting system carries and loads the next photosensitive substrate, which has been cooled by the temperature-adjustment plate, onto the substrate stage. A pattern image of a mask is exposed and transferred onto the next photosensitive substrate through a projection optical system.

10 Claims, 5 Drawing Sheets

EXPOSURE METHOD AND EXPOSURE APPARATUS

This is a divisional of application Ser. No. 09/388,607, filed Sep. 2, 1999 now U.S. Pat. No. 6,228,544, which is a continuation of application Ser. No. 08/908,429, filed Aug. 7, 1997, abandoned the entire content of which is hereby incorporated by reference in this application.

BACKGROUND OF THE INVENTION

This invention relates to an exposure apparatus used in a photolithography process for manufacturing, for example, semiconductor devices, liquid crystal display devices, image pick-up devices, thin-film magnetic heads, and the like.

In manufacturing a semiconductor device or the like using a photolithographic technique, a step-and-repeat type exposure apparatus has been conventionally used, in which a pattern of a photomask or a reticle (referred to as a mask) is projected and exposed through a projection optical system onto each shot area of a photosensitive substrate. Examples of the photosensitive substrate include a semiconductor wafer or a glass plate on which a photosensitizer (e.g., photoresist) is applied.

A photosensitive substrate is loaded on a substrate stage and moved within a two-dimensional plane, which is perpendicular to the optical axis (Z direction) of the projection optical system. A pair of moving mirrors are fixed onto the substrate stage. A pair of laser interferometers measure a distance from one of the moving mirrors, respectively, thereby detecting the coordinates of the substrate stage within the XY plane. A substrate stage control system drives the substrate stage by a predetermined amount in a stepwise manner within the coordinate system defined by the laser interferometers, so that each shot area of the photosensitive substrate is brought into alignment with the exposure field of the projection optical system.

A scanning type exposure apparatus has been developed, which scans the mask and the photosensitive substrate in a synchronized manner with respect to the projection optical system. This type of exposure apparatus allows a pattern to be exposed onto a shot area that is broader than the effective exposure field of the projection optical system. The scanning type exposure apparatus can be of a collective exposure type or a step-and-scan type. In a collective type exposure apparatus, a pattern of a mask is projected and exposed onto the entire area of a photosensitive substrate at a magnification ratio of one. In a step-and-scan type exposure apparatus, a mask pattern is exposed onto a single shot area of a photosensitive substrate at a certain reduction ratio, and when exposure of one shot area has been completed, the next shot area is brought into the exposure field in the stepwise manner.

In any type of exposure apparatus, a mask and a photosensitive substrate must be precisely aligned to superpose the mask pattern onto a pattern that has already been accurately formed on the photosensitive substrate. Generally, alignment sensors are provided in an exposure apparatus to detect a mask alignment mark that is formed on a mask and a substrate alignment mark that is formed on a photosensitive substrate. Based on the detected position of the alignment marks, the photosensitive substrate is aligned with the mask.

Alignment sensors used in the exposure apparatus include a TTL (through-the-lens) sensor system for detecting the position of the photosensitive substrate through the projection optical system, a TTM (through-the-mask) sensor system for detecting a positional relation between the mask and the photosensitive substrate through the projection optical system and the mask, and an off-axis sensor system for directly measuring the position of the photosensitive substrate without using the projection optical system. A reference mark is provided on the substrate stage for calibrating the alignment sensors and detecting a distance between the center of the projected image of the off-axis alignment system and the center of the projected image of the projection optical system, which is a so-called base-line amount.

In general, a projection optical system used in an exposure apparatus has a large numerical aperture (NA) and a shallow focal depth. In order to transfer a minute pattern onto a photosensitive substrate with high resolution, a mechanism is required for bringing the surface of the photosensitive substrate into an image forming plane of the projection optical system. To this end, an oblique-incident type multipoint autofocus (AF) system is provided to detect the focal point (i.e., the position along the optical axis) of a shot area on the photosensitive substrate and an inclination of the surface of the shot area. With the oblique-incident type autofocus system, a plurality of measurement points are set within a shot area of the photosensitive substrate, and a plurality of slit images are obliquely projected to the measurement points. The slit images reflected by the measurement points are formed on a photodetector. A focal point and an inclination of the shot area are determined from the image-forming positions of the slit images on the photodetector. Based on the detection result of the multipoint AF system, autoleveling control for making the surface of a shot area parallel to the focal plane of the projection optical system, and autofocus control for bringing the focal position on the surface of the photosensitive substrate into the focal position of the projection optical system are performed. In this manner, each shot area is brought into an acceptable range of the focal plane of the projection optical system.

As a mask pattern is repeatedly exposed onto respective shot areas of a photosensitive substrate, the temperature of the photosensitive substrate rises because of the exposure energy of the illumination light. Moreover, when the photoresist layer formed on the photosensitive substrate is exposed, a photochemical reaction is caused within the photoresist. If the photochemical reaction is an exothermic reaction, the temperature of the photosensitive substrate further increases. Since the photosensitive substrate thermally contacts the substrate stage, heat generated in the photosensitive substrate is transferred to the substrate stage through conduction so that the photosensitive substrate and the substrate stage are in thermal equilibrium.

A portion of the heat generated in the photosensitive substrate and transferred to the substrate stage is released in the air surrounding the photosensitive substrate and the substrate stage. However, most of the heat is accumulated on the substrate stage through the repeated pattern exposure process. As a result, the temperature of the substrate stage rises. The temperature rise in the substrate stage causes two major problems.

First, alignment between the mask and the photosensitive substrate is adversely affected. As has been mentioned above, various types of alignment sensors are used in an exposure apparatus, which are calibrated using a reference mark provided on the substrate stage. The reference mark is used by the off-axis alignment system to control the base-line amount. The reference mark is made of, for example, a quartz glass, on which a pattern is drawn by chromium and is fixed to the top surface of the substrate stage. If the temperature of the substrate stage changes, the reference mark slightly rotates.

Moving mirrors are also fixed to the substrate stage to measure the X and Y coordinates of the substrate stage. When the temperature of the substrate stage rises, the position and the fixing angle of the moving mirrors change due to thermal deformation of the supporting member of the moving mirrors. If the position or fixing angle of the moving mirror changes, the reference mark rotates relative to the moving mirror, which affects the base-line measurement. Deformation of the supporting member of the moving mirror causes errors in the orthogonality of the coordinate system, as well as an offset amount.

Second, the autofocus function is adversely affected. An exposure apparatus is generally positioned in a chamber in which the atmospheric temperature is maintained constant by a temperature adjuster. If the temperature of the substrate stage rises, the air surrounding the substrate stage wavers due to a temperature difference between the atmosphere and the substrate stage. An oblique incident AF detection system emits a detection beam obliquely with respect to the photosensitive substrate loaded on the substrate stage, and detects a beam reflected by the surface of the photosensitive substrate. If the air wavers around the substrate stage, the detection accuracy of the AF system drops due to the fluctuation of the air in the optical path of the detection beam. As a result, the autofocusing function of the apparatus deteriorates.

To cool the substrate stage, liquid cooling or air cooling may be considered. With liquid cooling, cooling tubes are attached to the substrate stage, through which a coolant is supplied. The substrate stage, however, generally includes various mechanisms, such as X and Y stages for moving the photosensitive substrate within the XY plane, a Z stage for moving the photosensitive substrate in the Z direction to perform autofocus control, a tilting mechanism for tilting the substrate-loading plane to level the exposed surface of the photosensitive substrate, and a loading/unloading mechanism for transferring the photosensitive substrate between the substrate stage and a substrate transporting mechanism. If cooling tubes are attached to the substrate stage, the structure of the substrate stage becomes further complicated. Moreover, whenever the substrate stage moves, the cooling tubes are trailed between the substrate stage and the pump for supplying a coolant, which imposes a large amount of load on the stage driving unit. On the other hand, the alternative air cooling method is inferior in cooling efficiency.

SUMMARY OF THE INVENTION

The present invention was conceived in view of the drawbacks in the prior art, and it is an object of the invention to provide an exposure apparatus and an exposure method that can efficiently avoid a temperature rise in the substrate stage, even if pattern exposure is repeated, without providing liquid cooling means or air cooling means.

This and other objects of the invention are achieved by removing a quantity of heat from a photosensitive substrate prior to loading the photosensitive substrate onto the substrate stage. The quantity of heat corresponds to a heat accumulation amount on the stage during an exposure of a single photosensitive substrate. A substrate stage is defined as a device for loading and moving a photosensitive substrate in an exposure apparatus, and therefore, a substrate holder, moving mirrors, and other auxiliary components are regarded as a part of the substrate stage.

In one aspect of the invention, an exposure method is provided for exposing a pattern of a mask onto a photosensitive substrate. Prior to loading the photosensitive substrate onto the substrate stage, a quantity of heat that corresponds to a heat quantity accumulated on the substrate stage during an exposure of one photosensitive substrate is removed from the photosensitive substrate.

The heat quantity accumulated on the substrate stage during exposure depends on the transmissivity of the mask, the reflectivity of the photosensitive substrate, the characteristic of the photosensitizer (photoresist), the number of shots made on one photosensitive substrate, the time required for exposing one photosensitive substrate, the time required for alignment, and other parameters. The heat quantity may be determined through calculation; however, it is more practical to determine the heat quantity on an experimental basis.

For example, the heat quantity accumulated on the substrate stage during exposure may be determined by loading a photosensitive substrate that has a temperature substantially equal to the substrate stage temperature onto the substrate stage, and by detecting a temperature rise of the substrate stage that occurs when a mask pattern is exposed onto the photosensitive substrate.

A temperature-adjustment plate may be used to remove the corresponding heat quantity from the photosensitive substrate. The temperature-adjustment plate is cooled in advance to a temperature substantially equal to a target temperature for the photosensitive substrate. The photosensitive substrate is loaded on the temperature-adjustment plate so as to directly contact the plate for a predetermined period of time. The temperature-adjustment plate may be cooled through the liquid cooling method using a coolant, or an electric cooling method using, for example, a Peltier element.

To determine the temperature of the temperature-adjustment plate, the temperature of the substrate stage is detected when a photosensitive substrate has been exposed. The temperature of the temperature-adjustment plate is set based on the detected temperature of the substrate stage. The temperature of the substrate stage may be measured using a test substrate. Alternatively, in the case in which a plurality of photosensitive substrates are successively exposed in a lot, the temperature of the substrate stage may be measured using the first photosensitive substrate of the lot.

Another way of removing the corresponding heat quantity from the photosensitive substrate is to place the photosensitive substrate in a space in which the atmospheric temperature has been set to a temperature substantially equal to the target temperature for a predetermined period of time. With this method, it is preferable to use a plate that is made of a material with a high thermal conductivity to efficiently cool the photosensitive substrate. The plate is positioned within the space in which the atmospheric temperature is set substantially equal to the target temperature of the photosensitive substrate. The photosensitive substrate is mounted on the plate, which is now in thermal equilibrium with the atmosphere in the space, and efficiently cooled through direct contact between two solid bodies.

In another aspect of the invention, an exposure apparatus is provided that comprises a substrate stage for supporting a photosensitive substrate, a projection optical system for projecting a pattern formed in a mask onto the photosensitive substrate, and a temperature-adjustment plate for cooling the photosensitive substrate to remove a quantity of heat from the photosensitive substrate prior to loading the photosensitive substrate onto the substrate stage. The quantity of heat corresponds to a heat quantity that is accumulated on the substrate stage during exposure of a photosensitive substrate.

A temperature sensor may be attached to the substrate stage to control the temperature of the temperature-adjustment plate.

With this arrangement, it is not necessary to provide cooling tubes for supplying a coolant to the substrate stage. A photosensitive substrate is first brought into contact with the temperature-adjustment plate to cool down, and then loaded on the substrate stage, whereby the temperature of the substrate stage can be maintained substantially constant based on heat exchange throughout the exposure process. This method is much more effective than the air cooling method.

BRIEF DESCRIPTION OF THE DRAWINGS

These and other aspects and advantages of the present invention will be described in detail with reference to the accompanying drawings, in which:

FIGS. 2(a) and 2(b) illustrate the substrate stage used in the exposure apparatus shown in FIG. 1, in which FIG. 2(a) is a plan view, and FIG. 2(b) is a cross-sectional view taken along the A—A line of FIG. 2(a);

FIGS. 3(a)–(c) illustrate an example of the temperature-adjustment plate, in which FIG. 3(a) is a top view of the temperature-adjustment plate, FIG. 3(b) is a cross-sectional view taken along the B—B line of FIG. 3(a), and FIG. 3(c) is a bottom view;

DETAILED DESCRIPTION OF PREFERRED EMBODIMENTS

Figure 1:
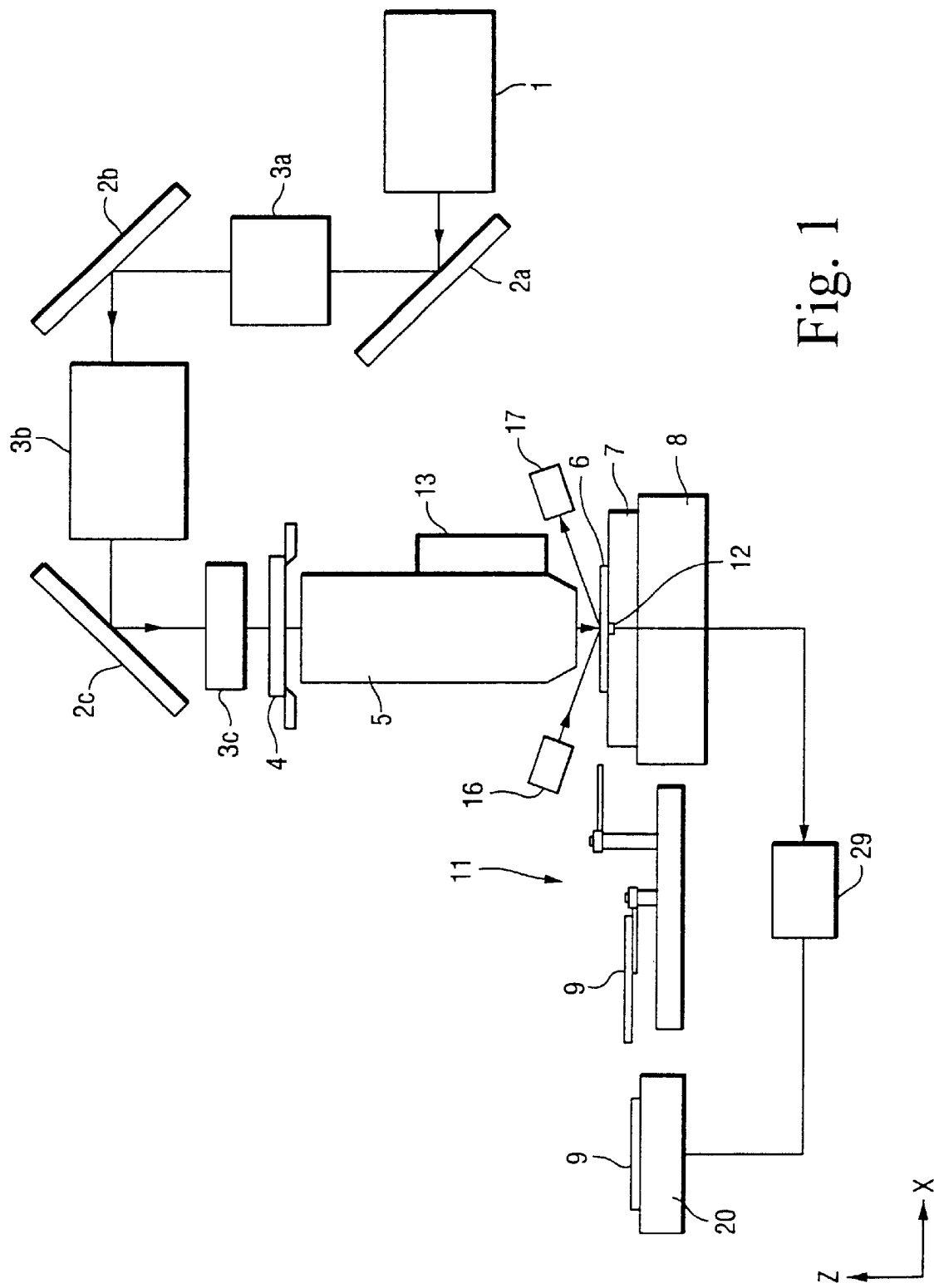
FIG. 1 is a schematic block diagram of an exposure apparatus according to an embodiment of the invention.

FIG. 1 illustrates an exposure apparatus according to an embodiment of the invention. Illumination light emitted by a light source 1, such as a mercury-vapor lamp or excimer laser, passes through illumination optical elements 3a–3c, while being reflected by reflective elements 2a–2c. The illumination optical elements 3a–3c shape the illumination light into a uniform illumination light beam. The mask 4, in which a pattern is formed, is illuminated by the shaped light beam with a uniform illuminance distribution. A pattern image of the mask 4 is formed through the projection optical system 5 onto the photosensitive substrate 6, which is coated with a photoresist. The mask pattern is thus transferred onto the photosensitive substrate 6. The photosensitive substrate 6 is held by the substrate holder 7 on the substrate stage 8, which is movable within a two-dimensional plane.

An alignment system 13 is provided in the vicinity of the projection optical system 5 to detect an alignment mark that is formed on the photosensitive substrate 6 and a reference mark 14 (shown in FIG. 2) that is formed on the substrate stage 8. An oblique incident AF system, which is composed of a light;transmitting system 16 and a light-receiving system 17, is also provided to detect a focal position (Z position) of the photosensitive substrate 6. The oblique incident AF system has a known structure, and is disclosed in, for example, Japanese patent application laid-open no. 5-275313.

Figure 2A:
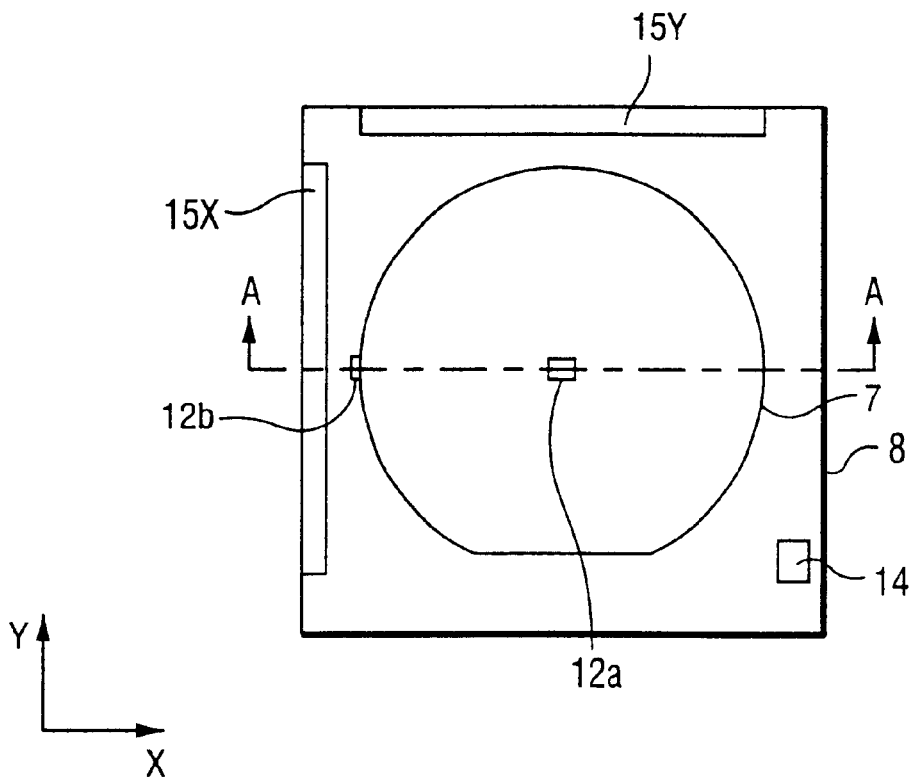
Figure 2B:
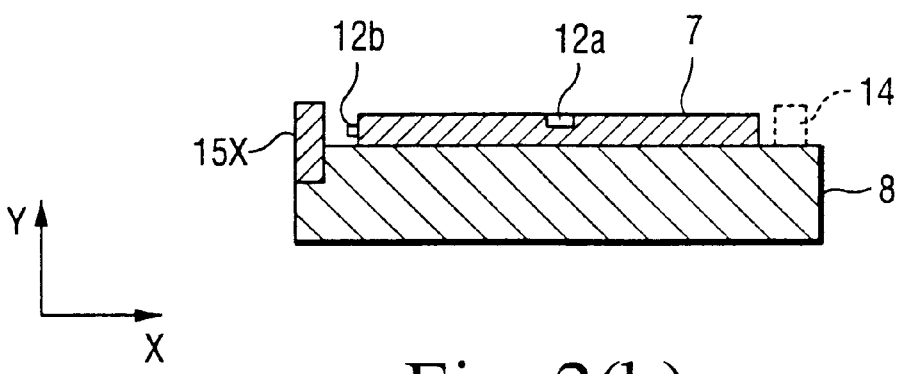

FIGS. 2(a) and 2(b) illustrate the substrate stage 8. FIG. 2(a) is a plan view, and FIG. 2(b) is a cross-sectional view taken along the A—A line in FIG. 2(a). The substrate stage 8 is equipped with an X-direction moving mirror 15X for detecting an X position of the substrate stage 8, and a Y-direction moving mirror 15Y for detecting a Y position of the substrate stage 8. Laser beams are emitted by a pair of interferometers (not shown), respectively, toward the moving mirrors 15X and 15Y. The interferometers determine the X and Y positions of the substrate stage 8 based on the laser beams reflected from the moving mirrors 15X and 15Y. A reference mark 14 is provided on the substrate stage 8. A temperature sensor 12, which consists of a thermocouple or platinum resistor, is fixed to the substrate holder 7 mounted on the substrate stage 8. An output of the temperature sensor 12 is connected to an input of a controller 29. The temperature sensor 12 may be buried in the top surface of the substrate holder 7 as indicated by the symbol 12a, or attached to the side face of the substrate holder 7 as indicated by the symbol 12b.

Referring back to FIG. 1, the photosensitive substrate 9, which is the next substrate to be exposed after the photosensitive substrate 6, is loaded on the temperature-adjustment plate 20 at a waiting position. The photosensitive substrate 9 is transferred between the waiting position and the substrate holder 7 on the substrate stage 8 through a substrate transporting device 11. The temperature of the temperature-adjustment plate 20 is set to a target temperature T2 of the photosensitive substrate. The target temperature T2 is lower than the atmospheric temperature T1 that surrounds the substrate stage 8 (i.e., T2<T1). While the current photosensitive substrate 6 is held by the substrate holder 7 on the substrate stage 8, the next photosensitive substrate 9 is loaded on the temperature-adjustment plate 20, which has been cooled to temperature T2. Since the next photosensitive substrate 9 directly contacts the temperature-adjustment plate 20, heat exchange occurs between the photosensitive substrate 9 and the temperature-adjustment plate 20, and the next photosensitive substrate 9 reaches thermal equilibration with the temperature-adjustment plate 20. In this manner, the next photosensitive substrate 9 is cooled to T2 before it is loaded on the substrate stage 8 for exposure.

Figure 3A:
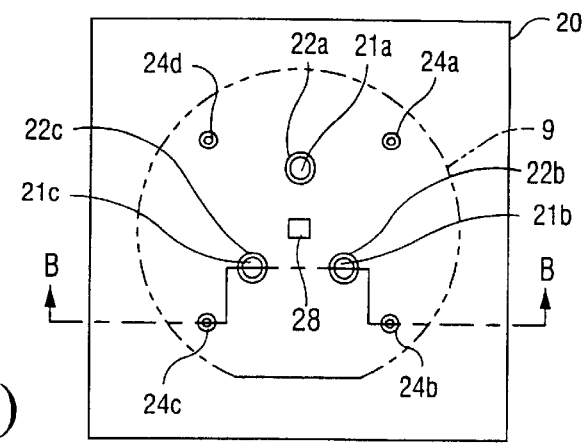
Figure 3B:
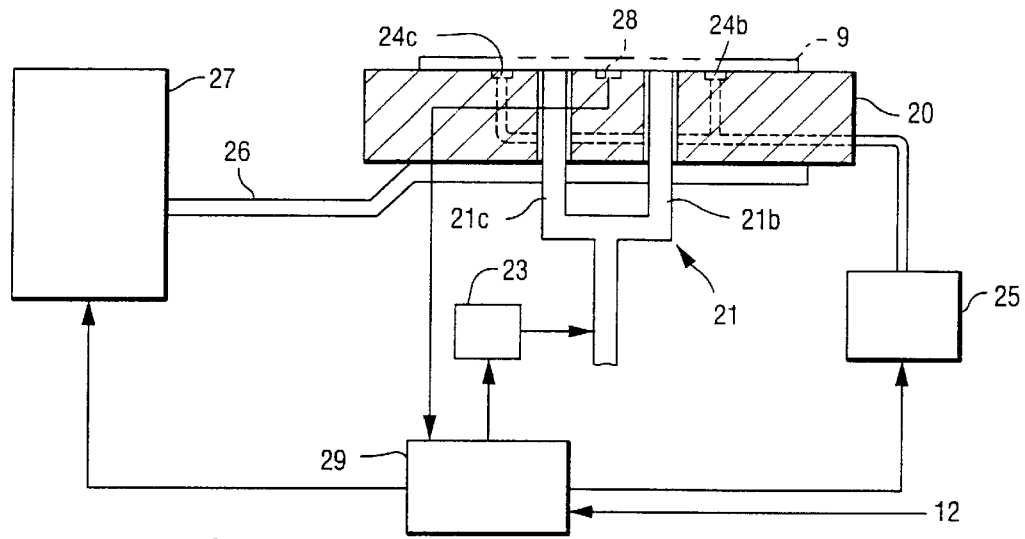
Figure 3C:
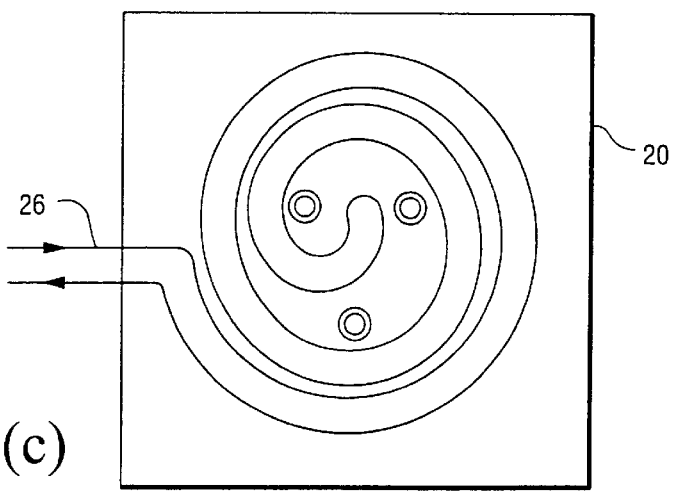

FIGS. 3(a)–(c) show the detailed structure of an example of the temperature-adjustment plate 20. FIG. 3(a) is a top view of the temperature-adjustment plate 20, FIG. 3(b) is a cross-sectional view taken along the B—B line of FIG. 3(a), and FIG. 3(c) is a bottom view.

The temperature-adjustment plate 20 is made of a material with a high thermal conductivity, including, for example, an aluminum alloy or ceramics. The temperature-adjustment plate 20 has a substrate lifting de vice 21 in the middle portion. The substrate lifting device 21 lifts the photosensitive substrate 9 up and down to pass and receive the photosensitive substrate 9 to and from the substrate transporting device 1. The substrate lifting device 21 has three spindles 21a–21c that fit into through-holes 22a–22c penetrating the temperature-adjustment plate 20 from the top to the bottom thereof. Each of the spindles 21a–21c has an adsorption hole at the tip, through which vacuum adsorption is applied to the photo sensitive substrate 9. In other words, the spindles 21a–21c support the photosensitive substrate 9 through vacuum adsorption, and in this state, they are vertically moved by a driving device 23, thereby transferring the photosensitive substrate 9 to and from the substrate transporting device 11.

Vacuum holes 24a–24d are formed on the surface of the temperature-adjustment plate 20. When the photosensitive substrate 9 is loaded onto the temperature-adjustment plate 20, the vacuum holes 24a–24d are evacuated by an evacuation device 25 to firmly hold the photosensitive substrate 9 o n the temperature-adjustment plate 20.

A cooling tube 26 is laid on the bottom face of the temperature-adjustment plate 20. A coolant, cooled to a predetermined temperature by a liquid conditioner 27, is supplied through the cooling tube 26 to remove the heat from the temperature-adjustment plate 20. A temperature sensor 28 is buried in the temperature-adjustment plate 20 consists of, for example, a thermocouple or platinum resistor. The controller 29 regulates the liquid conditioner 27, while monitoring the output from the temperature sensor 28, so that the temperature of the temperature-adjustment plate 20 is maintained at the preset target temperature T2. The controller 29 also regulates the evacuation device 25 and the driving device 23 for driving the substrate lifting device 21.

Figure 4:
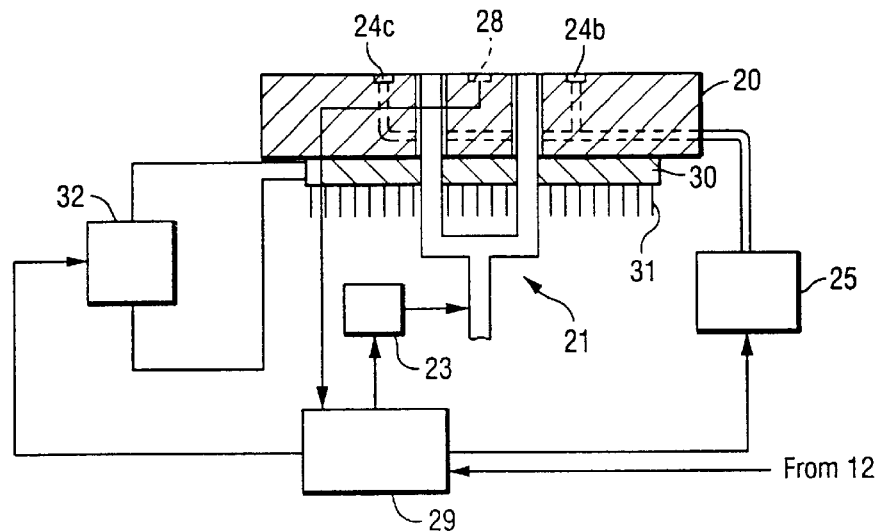
FIG. 4 illustrates another example of the temperature-adjustment plate

FIG. 4 illustrates another example of the temperature-adjustment plate 20. This temperature-adjustment plate 20 uses a Peltier element, instead of a coolant, to cool the photosensitive substrate. FIG. 4 corresponds to FIG. 3(b), and the same elements are denoted by the same symbols.

As shown in FIG. 4, a Peltier element 30 is attached to the bottom face of the temperature-adjustment plate 20 so that the cooling surface of the Peltier element 30 directly contacts the temperature-adjustment plate 20. The radiating surface of the Peltier element 30 is equipped with a radiation fin 31. The Peltier element 30 is connected to a power source 32. The controller 29 regulates the power source voltage, while monitoring the output from the temperature sensor 28, so that the temperature of the temperature-adjustment plate 20 is maintained at the preset temperature T2.

The preset temperature T2 of the temperature-adjustment plate 20 is determined in the following way. Assuming the atmospheric temperature surrounding the substrate stage 8 is set to T1, then the temperature T2 for the temperature-adjustment plate 20 is defined as:

$$T2=T1-\Delta T$$

If exposure light generates thermal energy E(J) during an exposure of a photosensitive substrate, and if the photosensitive substrate has a volume $V(cm^3)$ and a heat capacity $C(J/Km^3)$, then the change $\Delta T$ in the temperature is expressed as:

$$\Delta T=E/(CV)$$

Because, however, a time taken for an exposure of a photosensitive substrate varies depending on the type of the photoresist applied to the photosensitive substrate, the thickness of the photoresist film, and the reflectivity of the undercoat, the thermal energy generated in each photosensitive substrate also varies. Therefore, the preset temperature T2 of the temperature-adjustment plate 20 must be slightly adjusted. Moreover, not all the heat generated in the photosensitive substrate is transmitted to the substrate stage, but a portion of the heat generated in the photosensitive substrate 6 is released into the atmosphere. For these reasons, it is more practical to determine T2 based on actual measurement, rather than through calculation.

Figure 5:
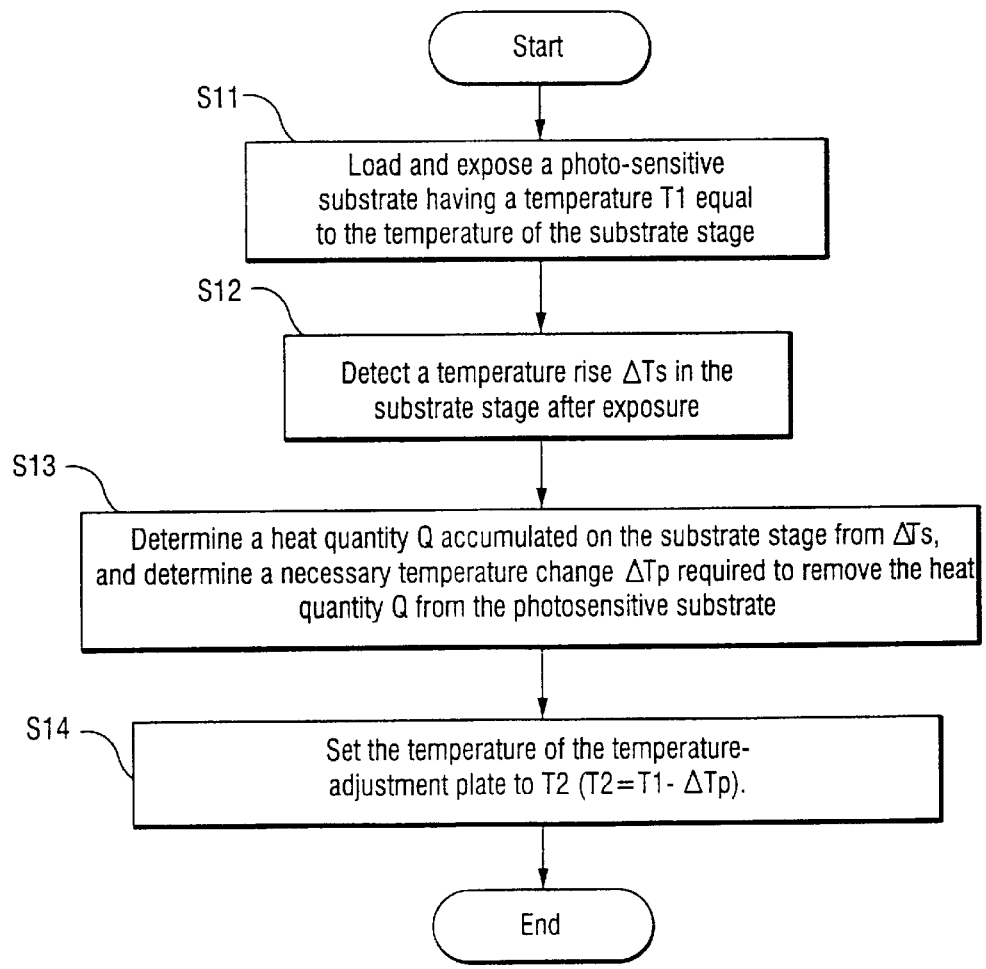
FIG. 5 is a flowchart showing a method of determining the temperature of the temperature-adjustment plate according to an embodiment of the invention.

FIG. 5 is a flowchart showing an example of a method for determining the temperature T2 of the temperature-adjustment plate 20 through actual measurement. This method utilizes the output from the temperature sensor 12, which is fixed to the substrate holder 17. In step S11, a photosensitive substrate 6, which has a temperature T1 equal to the temperature of the substrate stage 8, is loaded on the substrate stage 8 and moved in a stepwise manner by the substrate stage 8 until all the shot areas of the photosensitive substrate 6 are exposed. In step S12, a temperature rise $\Delta Ts$ in the substrate stage 8 is measured after the exposure of all the shot areas of the photosensitive substrate 6. Because the substrate holder 7 and the substrate stage 8 are in thermal equilibrium with good mutual heat conduction, the controller 29 can determine the temperature rise $\Delta Ts$ in the substrate stage 8 from a change in the output of the temperature sensor 12 before and after the exposure of the photosensitive substrate 6.

In step S13, the controller 29 determines a heat quantity Q accumulated on the substrate stage 8 during the exposure of the photosensitive substrate 6, based on the temperature rise $\Delta Ts$ of the substrate stage 8 detected in step S12. Then, the controller 29 determines a necessary temperature change $\Delta Tp$ required to cool the temperature-adjustment plate 20 and remove the heat quantity Q from the subsequent photosensitive substrates. The relation between the temperature rise of the substrate stage 8 and the heat quantity accumulated on the substrate stage 8, and the relation between the temperature change in the photosensitive substrate and the heat quantity were determined in advance by experimentation.

In step S14, the controller 29 controls the liquid conditioner 27 (FIG. 3) or the power source (FIG. 4) to set the temperature of the temperature-adjustment plate 20 to n which is expressed as:

$$T2=T1-\Delta Tp$$

The next photosensitive substrate is loaded on the temperature-adjustment plate 20, which has been cooled to temperature T2 according to the heat accumulation on the substrate stage 8, before it is loaded on the substrate stage 8. Thus, a quantity of heat corresponding to the heat accumulation on the substrate stage 8 is removed from the next photosensitive substrate 9 by the temperature-adjustment plate 20 in advance, thereby preventing excessive heat accumulation on the substrate stage 8 during exposure. In this manner, a temperature rise in the substrate stage 8 can be prevented even if a plurality of photosensitive substrates are successively exposed as long as a predetermined amount of heat is removed from the photosensitive substrates before they are loaded on the substrate stage 8. Since the temperature of the substrate stage 8 is maintained constant throughout the exposure process, a drop in alignment accuracy between the mask 4 and the photosensitive substrate 6 due to rotation or deformation of the reference mark 14 formed on the substrate stage 8, or deterioration in autofocusing accuracy due to fluctuation of the air can be prevented.

The temperature adjustment plate 20 may remove a quantity of heat greater than the heat quantity Q that is accumulated on the substrate stage 8 during exposure of the photosensitive substrate as long as the photosensitive substrate is prevented from being distorted by the heat accumulated on the substrate stage 8, and as long as the reference mark is prevented from rotating due to the heat.

The temperature sensor 12 fixed to the substrate holder 7 continuously detects the temperature of the substrate stage 8 and supplies the detection result to the controller 29. When the controller 29 detects a temperature change in the substrate stage 8 such that there is still an unacceptable temperature rise at the end of the exposure step of the current photosensitive substrate, the controller 29 can adjust the preset target temperature n of the temperature-adjustment plate 20 so that the temperature of the substrate stage 8 returns to an acceptable temperature by the end of the exposure step of the next photosensitive substrate. For example, if the liquid cooling temperature-adjustment plate 20 shown in FIG. 3 is used, the controller 29 regulates the liquid conditioner 27 to change the temperature of the coolant; if the Peltier element temperature-adjustment plate 20 is used, the controller 29 regulates the power source 32 to change the voltage.

Figure 6:
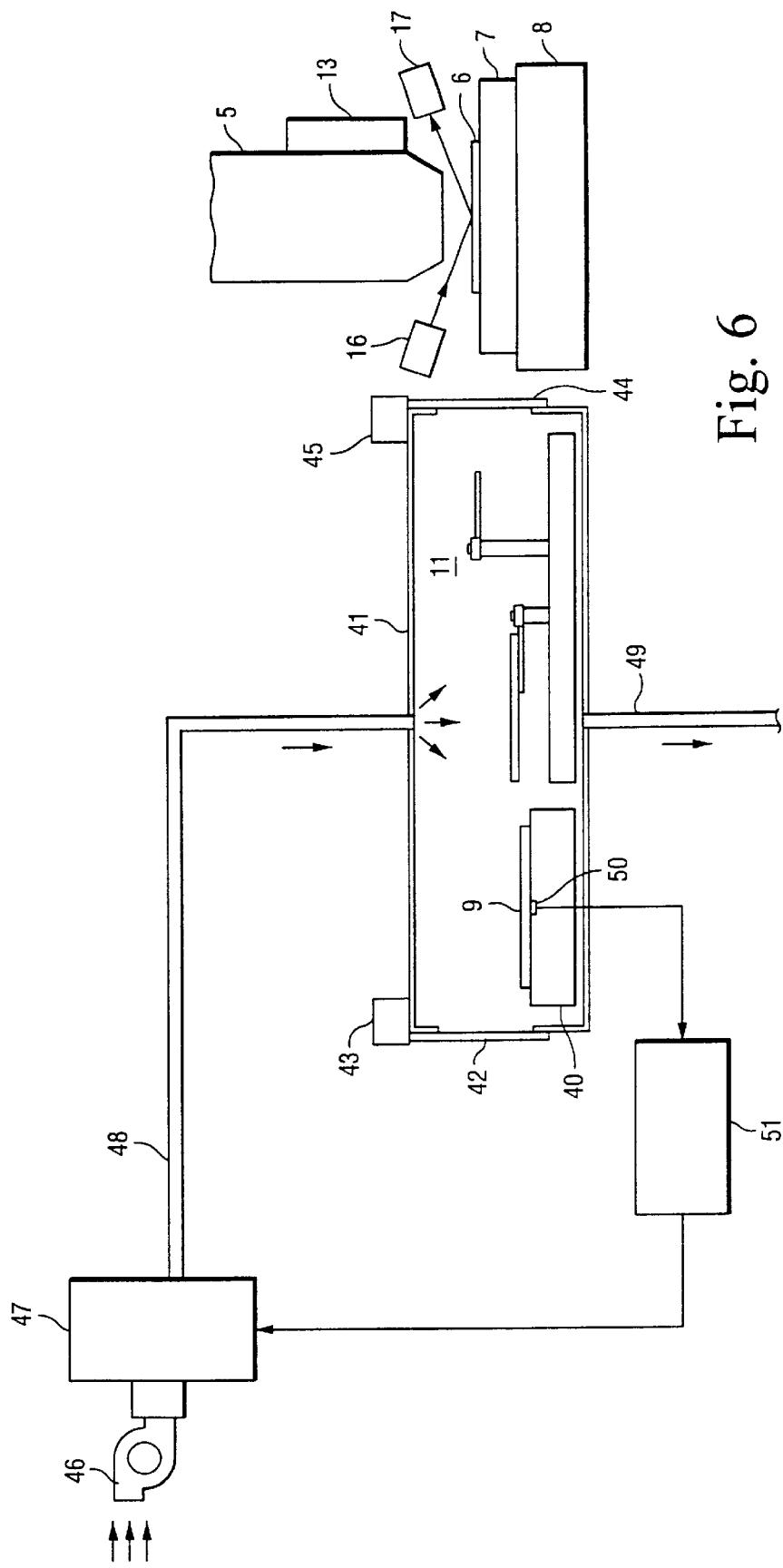
FIG. 6 is a schematic diagram of an exposure apparatus according to another embodiment of the invention.

FIG. 6 illustrates another example of the exposure apparatus according to the present invention In the previous example, a temperature-adjustment plate uses a coolant or a Peltier element to cool the photosensitive substrate. In this example, the photosensitive substrate is cooled in a chamber in which the atmospheric temperature is set to the target temperature T2.

A mount plate 40 for mounting the next photosensitive substrate 9 and a substrate transporting device 11 are positioned within the chamber 41. The chamber 41 is filled with air cooled to the predetermined target temperature T2. The mount plate 40 is made of a material with a high thermal conductivity including, for example, an aluminum alloy or ceramics. The air is taken in by a vacuum ventilation fan 46 and cooled to the predetermined temperature by an air conditioner 47. The cooled air is supplied into the chamber 41 through a blast pipe 48. The air within the chamber 41 is exhausted through an exhaust pipe 49 outside the exposure apparatus. The mount plate 40 has a temperature sensor 50. A controller 51 monitors the output from the temperature sensor 50 and controls the air conditioner 47 so that the temperature of the chamber 41 is maintained at the predetermined target temperature T2.

Similar to the previous example, the temperature sensor 12 continuously detects the temperature of the substrate stage 8. When the controller 51 detects an unacceptable temperature increase in the substrate stage 8 at the end of the exposure step of the current photosensitive substrate, the controller 51 can adjust the predetermined target temperature T2 of the air conditioner 47 so that the temperature of the substrate stage 8 returns to an acceptable temperature by the end of the exposure step of the next photosensitive substrate.

Shutters 42, 44 are provided at the entrance and the exit of the chamber 41. The shutters 42 and 44 are opened and closed by shutter driving devices 43 and 45, respectively, only when the photosensitive substrate is introduced into and sent out of the chamber 41, so that leakage of the cooled air is suppressed as much as possible, and the temperature of the chamber 41 is maintained constant.

While the current photosensitive substrate 6, which is held by the substrate holder 7 on the substrate stage 8, is being exposed, the next photosensitive substrate 9 is loaded on the mount plate 40 within the chamber 41 filled with the cooled air. The next photosensitive substrate 9 is cooled to a temperature T2 within the chamber 41 through heat exchange with the cooled air and the mount plate 40, which has been cooled to temperature T2 by the cooled air. Then, the shutter 44 is opened by the driving device 45, and the substrate transporting device 11 carries the next photosensitive substrate 9 to the substrate holder 7 on the substrate stage 8.

With the exposure method and apparatus of the invention, heat accumulation on the substrate stage is efficiently avoided without providing liquid cooling means or air cooling means. Accordingly, pattern exposure can be successively and repeatedly performed while suppressing a temperature rise in the substrate stage. Alignment accuracy between the mask and the photosensitive substrate and autofocusing accuracy can be maintained in the exposure apparatus.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims. For example, although the present invention has been described using an example of an exposure apparatus that uses a mercury-vapor lamp or an excimer laser as a light source, the invention is not limited to this arrangement. The invention can be applied to an X-ray exposure apparatus using an X-ray light source or an electron beam exposure apparatus, which emits charged particles directly onto a substrate without inserting a mask between the light source and the substrate.

What is claimed is:

1. An exposure apparatus comprising:
    a substrate stage that supports a substrate;
    a projection optical system disposed in a vicinity of the substrate stage, the projection optical system projecting a pattern formed in a mask onto the substrate; and
    a temperature-adjustment plate disposed remote from the substrate stage, the temperature-adjustment plate adjusting a temperature of the substrate to be lower than a temperature of the substrate stage by removing a quantity of heat from the substrate prior to loading the substrate onto the substrate stage, the quantity of heat corresponding to a heat quantity that is accumulated on the substrate stage during exposure of the substrate.

2. An exposure apparatus according to claim 1, further comprising:
    a temperature sensor fixed to the substrate stage; and
    a controller communicating with the temperature sensor and the temperature-adjustment plate, the controller controlling the temperature of the temperature-adjustment plate based on an output from the temperature sensor.

3. An exposure apparatus as claimed in claim 1, further comprising:
    a temperature sensor fixed to the temperature-adjustment plate; and
    a controller communicating with the temperature sensor and maintain the temperature of the temperature-adjustment plate based on an output from the temperature sensor.

4. An exposure apparatus according to claim 1, wherein the temperature-adjustment plate is formed of a material with a high thermal conductivity.

5. An exposure apparatus according to claim 1, wherein the temperature-adjustment plate comprises:
    a temperature sensor buried in the temperature-adjustment plate;
    a cooling tube secured to one side of the adjustment plate and coupled with a source of liquid conditioner; and
    a controller communicating with the temperature sensor and controlling the liquid conditioner source, the controller regulating the liquid conditioner in accordance with an output from the temperature sensor.

6. An exposure apparatus according to claim 1, wherein the temperature-adjustment plate comprises:
    a temperature sensor buried in the temperature-adjustment plate;
    a Peltier element secured to one side of the adjustment plate and coupled with a power source; and
    a controller communicating with the temperature sensor and controlling the power source, the controller regulating the power source in accordance with an output from the temperature sensor.

7. An exposure apparatus according to claim 1, wherein the temperature-adjustment plate adjusts a temperature of the substrate while another substrate supported on the substrate stage is exposed.

8. An exposure apparatus for exposing a substrate into a prescribed pattern using radiation, the apparatus comprising:

a substrate stage that supports a substrate; and a heat remover disposed remote from the substrate stage, the heat remover adjusting the temperature of the substrate to be lower than a temperature of the substrate stage by removing a quantity of heat from the substrate prior to loading the substrate onto the substrate stage for a subsequent exposure process so as to prevent accumulation on the substrate stage during exposure of the substrate.

9. The exposure apparatus according to claim 8, wherein said quantity of heat corresponds to a heat quantity that is accumulated on the substrate stage during exposure of one substrate.

10. An exposure apparatus according to claim 8, wherein the heat remover removes a quantity of heat from the substrate while another substrate supported on the substrate stage is exposed.

* * * * *